(12) United States Patent
Sakamoto et al.

(10) Patent No.: US 8,169,784 B2
(45) Date of Patent: May 1, 2012

(54) CIRCUIT MODULE

(75) Inventors: Hideyuki Sakamoto, Gunma (JP);
Hidefumi Saito, Gunma (JP); Yasuhiro Koike, Gunma (JP); Masao Tsukizawa, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 887 days.

(21) Appl. No.: 12/239,215

(22) Filed: Sep. 26, 2008

(65) Prior Publication Data

US 2009/0086442 A1    Apr. 2, 2009

(30) Foreign Application Priority Data

Sep. 27, 2007    (JP) ................. 2007-252203

(51) Int. Cl.
*H05K 7/00* (2006.01)
(52) U.S. Cl. .................. 361/729; 361/775; 361/784
(58) Field of Classification Search .......... 361/775–784; 174/520–523; 257/691–692, 787–790
See application file for complete search history.

(56) References Cited

U.S. PATENT DOCUMENTS

| 4,901,203 A | 2/1990 | Kobayashi et al. |
| 5,105,322 A | 4/1992 | Steltzer |
| 5,408,383 A | 4/1995 | Nagasaka et al. |
| 5,444,297 A | 8/1995 | Oshima et al. |
| 5,519,252 A | 5/1996 | Soyano et al. |
| 5,586,388 A | 12/1996 | Hirao et al. |
| 5,610,799 A | 3/1997 | Kato |
| 5,646,827 A | 7/1997 | Hirao et al. |
| 5,657,203 A | 8/1997 | Hirao et al. |
| 5,694,294 A | 12/1997 | Ohashi et al. |
| 5,751,058 A | 5/1998 | Matsuki |
| 5,777,846 A | 7/1998 | Hayes et al. |
| 5,967,849 A | 10/1999 | Shiga et al. |
| 5,995,380 A | 11/1999 | Maue et al. |
| 6,027,535 A | 2/2000 | Eberle et al. |
| 6,072,122 A | 6/2000 | Hosoya |
| 6,081,425 A | 6/2000 | Cheng |
| 6,144,571 A | 11/2000 | Sasaki et al. |
| 6,147,869 A | 11/2000 | Furnival |
| 6,166,908 A | 12/2000 | Samaras et al. |
| 6,219,236 B1 | 4/2001 | Hirano et al. |

(Continued)

FOREIGN PATENT DOCUMENTS

JP    10-229288    8/1998
(Continued)

OTHER PUBLICATIONS

Sakamoto et al., U.S. Office Action mailed Nov. 13, 2009, directed to U.S. Appl. No. 12/239,286; 13 pages.

(Continued)

*Primary Examiner* — Tuan T Dinh
(74) *Attorney, Agent, or Firm* — Morrison & Foerster LLP

(57) ABSTRACT

To improve reliability of a circuit module by improving heat release performance and minimizing thermal influence on a device to be mounted, a base substrate having a first substrate mounted thereon is fitted into a lower portion of casing member, and a second substrate is installed in the upper portion of the casing member so that a spaced area can be provided. In addition, a drive device to be installed on the second substrate is positioned off the center of the second substrate.

5 Claims, 5 Drawing Sheets

U.S. PATENT DOCUMENTS

| | | |
|---|---|---|
| 6,226,182 B1 | 5/2001 | Maehara |
| 6,304,448 B1 | 10/2001 | Fukada et al. |
| 6,348,653 B1 | 2/2002 | Cho |
| 6,350,949 B1 | 2/2002 | Boyd |
| 6,421,244 B1 * | 7/2002 | Shinohara et al. ............ 361/736 |
| 6,509,629 B2 * | 1/2003 | Yoshimatsu et al. .......... 257/660 |
| 6,521,983 B1 | 2/2003 | Yoshimatsu et al. |
| 6,583,355 B2 | 6/2003 | Skrzypchak |
| 6,690,582 B2 | 2/2004 | Sumida |
| 6,717,812 B1 | 4/2004 | Pinjala et al. |
| 6,801,430 B1 | 10/2004 | Pokharna |
| 6,958,535 B2 | 10/2005 | Hirano et al. |
| 6,995,461 B2 | 2/2006 | Soyano et al. |
| 7,209,367 B2 | 4/2007 | Nakano et al. |
| 7,218,517 B2 | 5/2007 | Wolford et al. |
| 7,248,471 B2 | 7/2007 | Wabiszczewicz |
| 7,375,287 B2 | 5/2008 | Rathmann |
| 7,589,978 B1 | 9/2009 | Holdredge et al. |
| 7,623,347 B2 | 11/2009 | Matsui |
| 7,706,146 B2 | 4/2010 | Lee et al. |
| 7,751,194 B2 | 7/2010 | Sakamoto et al. |
| 7,782,628 B2 | 8/2010 | Sakamoto et al. |
| 7,839,655 B2 | 11/2010 | Clark |
| 2008/0204998 A1 | 8/2008 | Matsui |
| 2009/0086431 A1 | 4/2009 | Sakamoto et al. |
| 2009/0086454 A1 | 4/2009 | Sakamoto et al. |
| 2009/0086455 A1 | 4/2009 | Sakamoto et al. |
| 2009/0103276 A1 | 4/2009 | Sakamoto et al. |
| 2010/0284159 A1 | 11/2010 | Sakamoto et al. |

FOREIGN PATENT DOCUMENTS

| | | |
|---|---|---|
| JP | 2000-228491 | 8/2000 |
| JP | 2007-36014 | 2/2007 |

OTHER PUBLICATIONS

Sakamoto et al., U.S. Office Action mailed Dec. 16, 2009, directed to U.S. Appl. No. 12/239,250; 8 pages.

Sakamoto et al., U.S. Office Action mailed Sep. 22, 2010, directed to related U.S. Appl. No. 12/239,256; 11 pages.

Sakamoto, H. et al., U.S. Office Action mailed Apr. 25, 2011, directed to U.S. Appl. No. 12/837,078; 10 pages.

Sakamoto, H. et al., U.S. Office Action mailed Feb. 4, 2011, directed to U.S. Appl. No. 12/239,256; 12 pages.

Sakamoto, H. et al., U.S. Office Action mailed May 10, 2011, directed to U.S. Appl. No. 12/239,407; 9 pages.

Sakamoto, H. et al., U.S. Office Action mailed Jul. 29, 2011, directed to U.S. Appl. No. 12/837,078; 11 pages.

Sakamoto, H. et al., U.S. Office Action mailed Nov. 15, 2010, directed to a related U.S. Appl. No. 12/837,078; 7 pages.

Sakamoto, H. et al., U.S. Office Action mailed Jun. 23, 2011, directed to U.S. Appl. No. 12/239,256; 13 pages.

Sakamoto et al., U.S. Office Action mailed Mar. 30, 2010, directed to related U.S. Appl. No. 12/239,256; 6 pages.

* cited by examiner

CIRCUIT MODULE

This application claims priority from Japanese Patent Application Number JP2007-252203 filed on Sep. 27, 2007, the content of which is incorporated herein by reference in its entirety.

BACKGROUND OF THE INVENTION

1. Field of the Invention

The present invention relates to a circuit module that handles a large amount of electric power.

2. Description of the Related Art

In recent years, environmental disruption, sign of global warming, and causes of the warming have been reported in newspapers. There exist a number of the causes, one of which is increased electric power consumption. The electricity largely depends on petroleum resources now being depleted, and a problem is emission of carbon dioxide gas into the atmosphere resulting from combustion of the petroleum. In addition, most of automobiles are gasoline-powered, which also worsen the problem.

Understandably, the former, electricity, is essential to drive electronic devices in every part of the world. Electricity serves as a power source for a washing machine, an air conditioner, portable devices, and the like, and is indispensable for all the people of the earth to maintain cultural life. Thus, the problem is a challenging theme to solve.

On the other hand, automobiles have become highly functional. For example, holding a TV conference within a vehicle or guiding to a destination by a car navigation system has become possible, a car air-conditioner is used for cooling, or head lights illuminate bright and sharply. As the functions become increasingly sophisticated, world's consumers prefer to buy these automobiles. In other words, unlike the old days, driving a car while using various functions in the car results in increased energy consumption. This also holds true for computers or portable phones.

In order to achieve these functions, semiconductor devices, such as so-called power devices, IC, and LSI have been introduced. These devices are mounted on a mounting board such as a printed circuit board, for example, and installed in a set of electronic devices. Given this matter, reduction in power consumption of semiconductor devices, has become an important issue.

The electronic devices, especially semiconductor devices, generate heat when operating, which increases the temperatures of their active areas, resulting in reduced driving ability. An attempt to enhance the driving ability leads to further increase in energy consumption.

In fact, it is necessary to reduce electric power that is consumed by semiconductor devices themselves by releasing heat of semiconductor devices to the outside in some way. The trend is clearly seen, for example, in power MOS devices that are capable of power driving, and requires some measure to release heat. For this reason, recently, devices such as inverter modules used in, for example, washing machines, refrigerators, and drive modules used in, for example, a plasma display have often been mounted on metal substrates to release heat.

The metal substrate has its surface covered by an insulating resin, and the like, and conductive patterns formed thereon. A device necessary for an inverter circuit, for example, is electrically connected to and mounted on the conductive patterns.

However, the number of circuit devices or conductive patterns that can be built on the top surface of one metal substrate is limited, and it was thus difficult to integrate on the top surface of one metal substrate a large hybrid integrated circuit formed of power devices and control devices. Then, forming conductive patterns in multiple layers on the top surface of a metal substrate would enable integration of a more complicated electric circuit. To make conductive patterns in multiple layers, however, an interlayer insulation layer should be provided between a lower layer conductive pattern and an upper layer conductive pattern, which may lead to a problem that the interlayer insulation film made of resin blocks conduction of heat released from circuit devices to the metal substrate.

In addition, if a metal substrate and a printed circuit board are superposed and arranged within casing member and connected with each other, a relatively large scale hybrid integrated circuit is achieved while utilizing an excellent heat release characteristic of the metal substrate. However, a circuit device made of a semiconductor material such as silicon, a metal substrate, and a printed circuit board have different thermal expansion coefficients, which thus results in problems that a solder connection between a circuit device and a printed circuit board may have cracks or conductive patterns formed on a metal substrate or a printed circuit board are disconnected.

SUMMARY OF INVENTION

The present invention has been made in light of the problems described above. Firstly, the present invention provides, for solving the problems, a circuit module having: a first module substrate including a first substrate of metal, at least a top surface of the first substrate being electrically insulated, a plurality of first conductive patterns made of electrically-conductive material provided on the top surface of the first substrate, and a power semiconductor device electrically connected with the first conductive patterns and mounted on the first substrate; a second module substrate including a resin substrate, a plurality of second conductive patterns made of electrically-conductive material provided on a top surface of the resin substrate, and a drive device electrically connected with the second conductive patterns and controlling the power semiconductor device; and a casing member of resin holding opposed sides of the first module substrate and opposed sides of the second module substrate that is located above the first module substrate with a space in between. In the circuit module, the drive device is positioned off the center of the resin substrate.

Secondly, the present invention provides, for solving the problems, a circuit module having: a first module substrate including a base substrate of metal, at least a top surface of the base substrate being electrically insulated, a first substrate fixed on the base substrate with electric insulation, at least a top surface of the first substrate being electrically insulated, a plurality of first conductive patterns made of electrically-conductive material provided on the top surface of the first substrate, and a power semiconductor device electrically connected with the first conductive patterns and mounted on the first substrate; a second module substrate including a second substrate of resin, a plurality of second conductive patterns made of electrically-conductive material provided on a top surface of the second substrate, and a drive device electrically connected with the second conductive patterns and controlling the power semiconductor device; and a casing member of resin holding opposed sides of the first module substrate and opposed sides of the second module substrate that is located above the first module substrate with a space in between. In the circuit module, the drive device is positioned off the center of the second substrate.

Thirdly, the present invention provides, for solving the problems, a circuit module comprising: a first module substrate including a Al base substrate with a rectangular shape, at least a top surface of the Al base substrate being electrically insulated, a first substrate of Al with a rectangular shape fixed onto the Al base substrate by an insulating adhesive and located inside a periphery of the base substrate, at least a top surface of the first substrate being electrically insulated, a plurality of first conductive patterns made of electrically-conductive material provided on the top surface of the first substrate, and a switching semiconductor device for an inverter, the switching semiconductor device electrically connected with the first conductive patterns and mounted on the first module substrate; a second module substrate including a second substrate of resin, a plurality of second conductive patterns made of electrically-conductive material provided on a top surface of the second substrate, and a microcomputer electrically connected with the second conductive patterns and controlling the switching semiconductor device; and a casing member of resin being shaped like a quadrangular prism having a hollow penetrating from an upper surface to a lower surface thereof with an opening portion, on the lower surface, abutting four sides of the base substrate, the casing member having a holding unit for holding a back surface of the second substrate inserted from an opening portion on the upper surface and located above the first module substrate with a space in between. In the circuit module the microcomputer is positioned off the center of the second substrate.

DESCRIPTION OF THE INVENTION

Figure 1A:
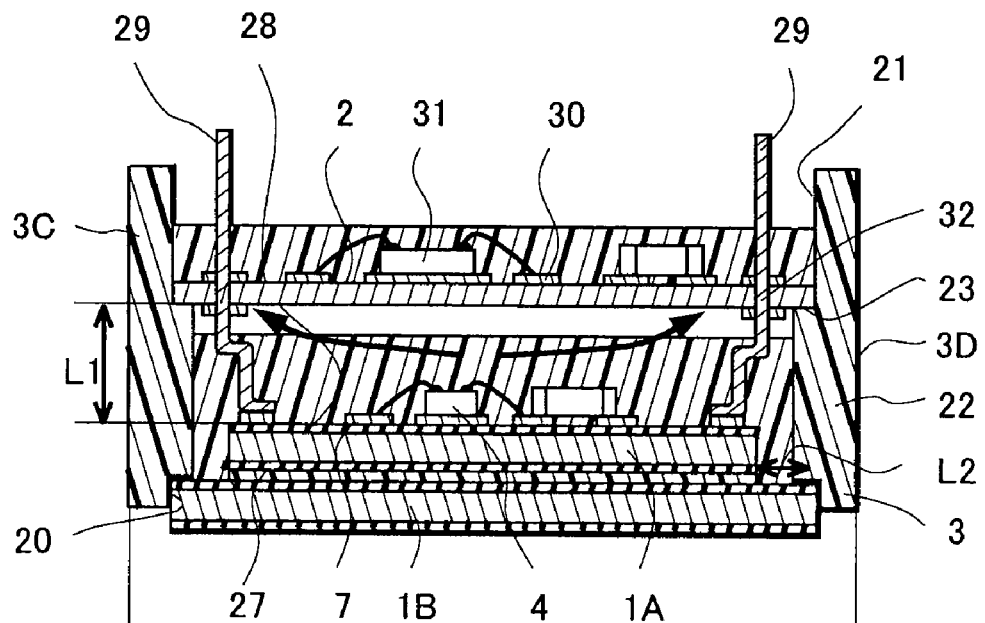
FIGS. 1A and 1B are views showing a circuit module according to a preferred embodiment of the invention.

With reference to FIG. 1, a configuration of a circuit module according to an embodiment of the invention will be described hereinafter. The circuit module mainly comprises a casing member 3 shaped like a picture frame, a base substrate 1B and a first substrate 1A that close an opening portion in the lower side of the casing member 3, and a second substrate 2 that closes an opening portion in the upper side of the casing member 3.

The metal substrate 1B is the base substrate and is formed to have a whole circumference larger than that of the first substrate 1A thereon on each side by a distance L2. The distance L2 is referred to as an extension distance that improves withstand voltage property of the first substrate 1A and a back side of the base substrate 1B in an actually configured circuit module.

The casing member 3 is now described. The casing member 3 is shaped like a quadrangular prism whose interior has been removed. In other words, it is integrally formed of four side walls, namely, a side wall 3A on the near side of the drawing, a side wall 3B on the far side, a wall 3D on the right, and a side wall 3C on the left. Thus, the casing member 3 has upper and lower opening portions 20, 21. On the inner side of the casing member 3 is a convex portion 22 facing inside. Thus, at a position somewhat lower than the upper opening portion are formed abutting areas 23 supporting the back side periphery of the second substrate 2. As seen in FIG. 1B, the abutting area 23 is formed on each of the inner walls of the casing member side walls 3C, 3D and abuts the back side adjacent to one of the right and left sides of the second substrate 2. On the other hand, to secure screwing holes 24, 24, the inner walls of the side walls 3A, 3B have areas 25 abutting the second substrate 2 and areas 26 spaced from the second substrate 2. The heat generated in a space between the second substrate 2 and the first substrate 1A is released outside through the spaced area 26.

In the following, the base substrate 1B and the first substrate 1A will be described. Each of the two substrates may be formed of an electrically-conductive material mainly containing Cu, Al, or Fe, for example, or formed of an alloy. In addition, the substrate may be formed of a material having good thermal conductivity. The substrate may be formed of an insulating material such as aluminum nitride, boron nitride, or the like. Generally, Cu or Al is adopted in terms of cost, and the description herein is given on the substrates that have adopted Al.

Figure 4:
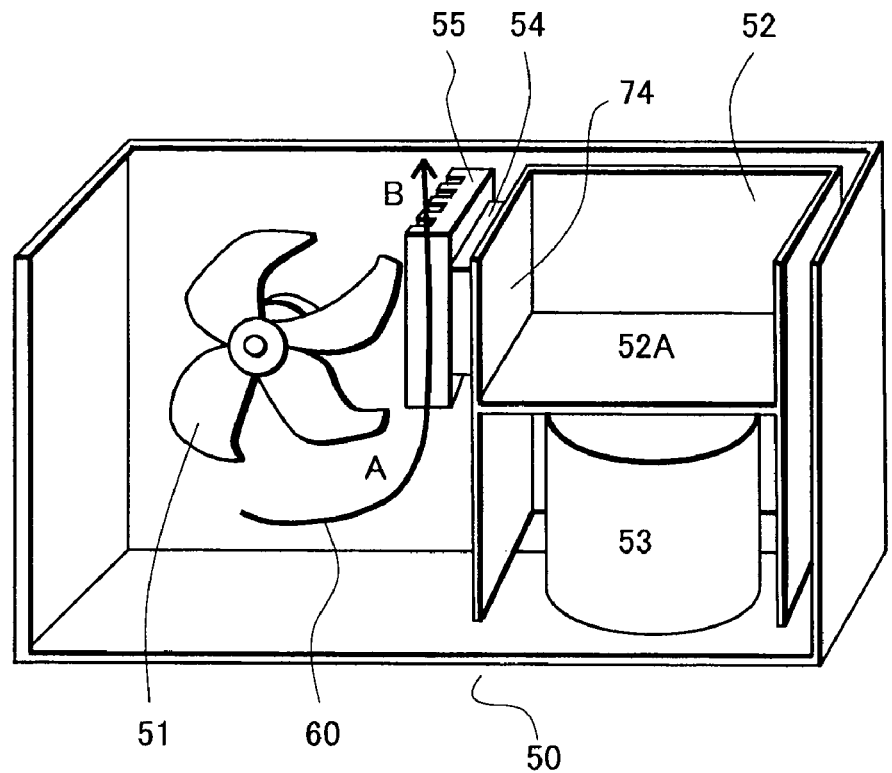
FIG. 4 is a view illustrating interior of an outdoor unit.

Since the two substrates are electrically conductive, they should be electrically insulated. Both surfaces of each of the base substrate 1B and the first substrate 1A are coated by an anodized film to prevent scratching. However, since the substrates are to be cut, Al is exposed at the center of their lateral sides. On the base substrate 1B is fixed the first substrate 1A by an insulating adhesive. The first substrate 1A is smaller in size, so that every side of the first substrate 1A is located inwardly from the corresponding sides of the base substrate 1B by the distance L2. Furthermore, to the anodized film formed on the top face of the first substrate 1A is applied an insulating coating 26 onto which a first conducive pattern 7 formed of Cu is bonded. The conductive pattern 7 includes an island, wiring, an electrode pad, an electrode for a passive device, and the like. For example, a power semiconductor device 4 includes a BIP type power Tr, a MOS type power Tr, IGBT, and the like, and electrically connected and affixed to an island. A surface electrode and the electrode pad of the device are connected by thin metal wire. In addition, a diode, a chip resistor, a chip capacitor, and the like are mounted. Furthermore, on the side of the first substrate 1A is provided a pad for affixing leads to which external leads 29 are affixed by brazing filler metal. The external leads 29 are long enough to protrude from the head of the casing member 3 and, as shown in FIG. 4, inserted into through holes on the mounting substrate prepared separately to be electrically connected.

A first module substrate formed by bonding the base substrate 1B and the first substrate 1A is fitted into the opening portion 20 on the lower side of the casing member 3. As described previously, the casing member 3 has the convex portion 22. In other words, an L-shaped step is provided in all the inner side walls. The first module substrate is fixed to the case member, such that the side surface of the base substrate 1B and the top surface forming an angle with the side surface are in contact with the L-shaped steps. Thus, the casing member 3 and the fitted first module substrate entirely shield the circuit module except the opening portion 21.

In the following, the second substrate 2 will be described. The second substrate 2 is made of a resinous substrate and a preferable example is a glass epoxy substrate called a printed circuit board. The second substrate 2 has conductive patterns with more than one layer formed at least on the top surface. Generally, the conductive patterns may be selected from one layer on the top surface, two layers on each surface, four layers on each surface and the like. To be specific, density of a device to be incorporated determines how many layers the second conductive pattern 30 will have. As similar to the first conductive pattern 7, the second conductive pattern 30 includes an island, wiring, an electrode pad, an electrode for a passive device, and the like. Then, a device to be mounted on the second conductive pattern 30 is an active device or a passive device, that is, a device 31 characteristic of the preferred embodiment of the invention.

The drive device 31 is an IC for driving and controlling the power semiconductor device 4 and includes a microcomputer, for example. The drive device 31 also includes a Tr, a diode, a chip resistor and a chip capacitor.

In addition, near the right and left sides of the second substrate 2 are through holes 32 into which the external leads 29 are inserted. The through holes 32 electrically connect the circuit formed on the first substrate 1A with the circuit formed on the second substrate 2.

The second module substrate is provided inside the casing member 3 through the upper opening portion 21. As described previously, the abutting areas 23, 25 are provided on the inner walls, of the casing member 3, on which the second substrate is installed.

Figure 1B:
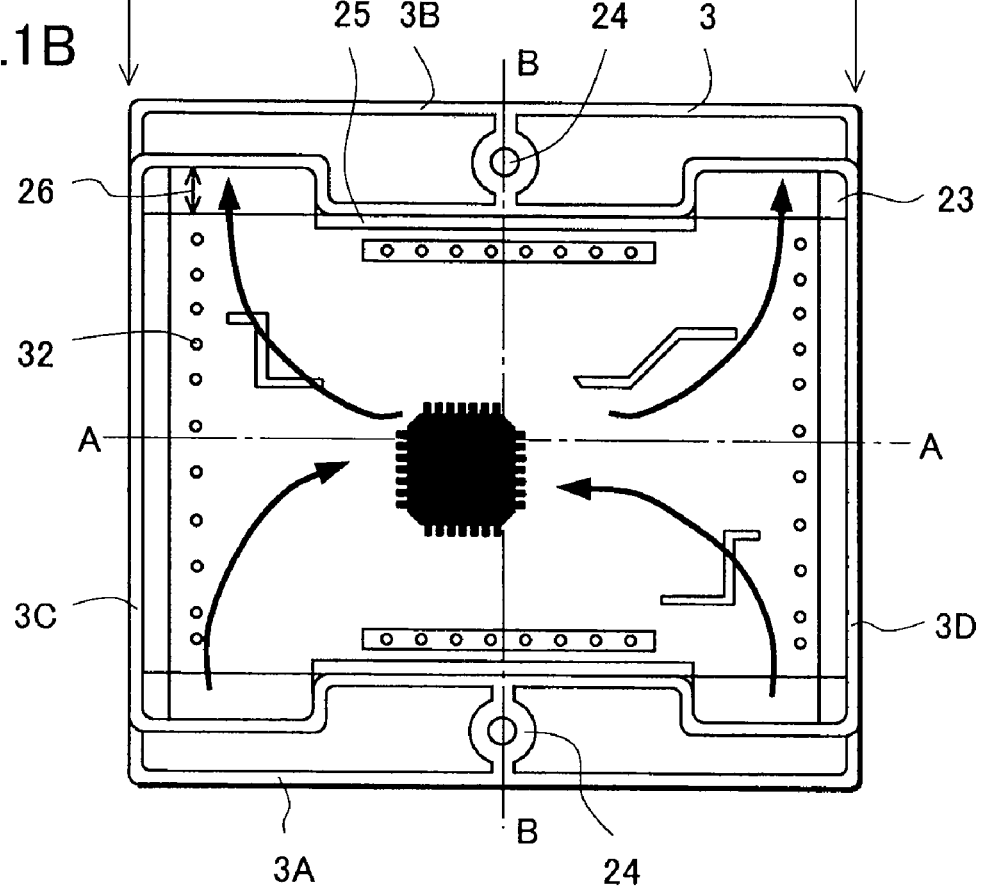

To prevent the brazing filler metal from cracking and external atmosphere from entering the interior through the spaced-apart areas 26, resin completely sealing devices of the first substrate is provided by potting, or the like as shown in FIG. 1A, before the second substrate is provided. Then, a distance from the top surface of the first substrate 1A to the back side of the second substrate 2 is set to L1. The thickness of the coating resin is S1, and a space S2 is provided. Air in the space S2 is heated by the first module substrate, and released outside through the spaced-apart areas 26. Thus, to cause air circulation, at least two spaced-apart areas are formed. In this embodiment, actually, four spaced-apart areas 26 are formed.

In addition, a resin for completely sealing devices is provided above the second substrate 2, as necessary. Now, the drive device 31 is mounted in bare state in FIG. 1A, and a resin-sealed semiconductor device is formed in FIG. 1B. Although they do not agree, in fact, either of them is acceptable.

Figure 2:
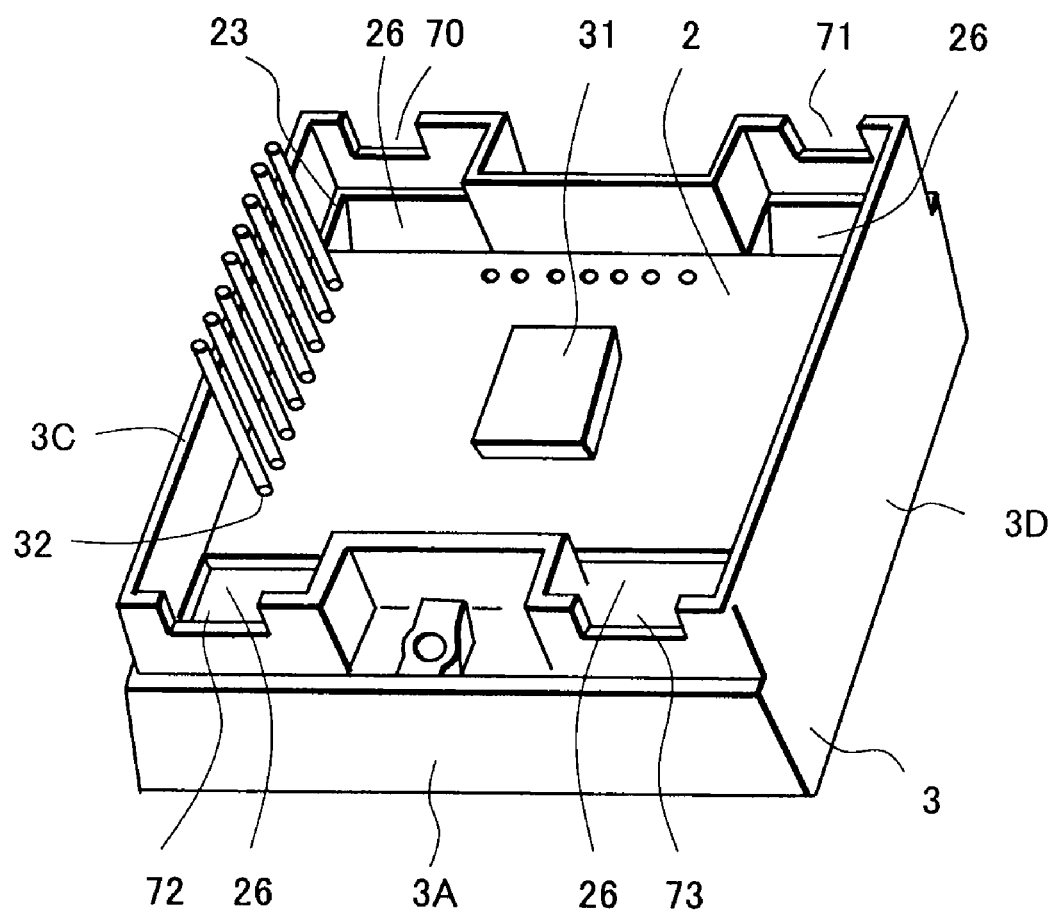
FIG. 2 is a perspective view showing the circuit module of FIG. 1.

FIG. 2 is a perspective view of the circuit module, which is shown separately in order to clarify a relation of the casing member 3 and the second substrate 2.

Figure 3:
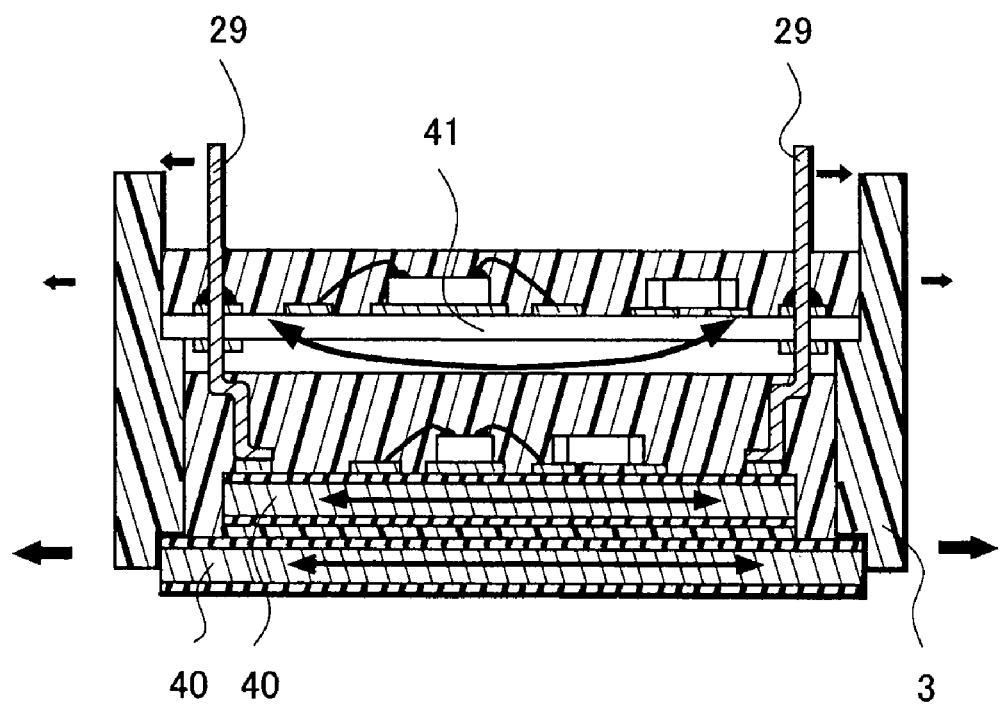
FIG. 3 is a view illustrating deformation due to expansion in the circuit module according to the preferred embodiment of the invention.

FIG. 3 illustrates thermal relationship of the resinous casing member 3, the first module substrate 40, the second module substrate 41, and even the external leads 29. By way of example, the circuit module provides an inverter circuit of the air conditioner and is mounted to an outdoor unit 50 as shown in FIG. 4, for example. FIG. 4 is a cutaway view of the outdoor unit 50 where 51 denotes an air circulating fan behind which a heat exchanger is located. To the right of the fan 51 is installed a frame 52 of Al or Fe. A compressor 53 is installed under an inner divider plate 52A, and a printed circuit board with circuit components mounted thereon is fixed above the inner divider plate 52A. In fact, the figure was simplified because there are quite complicated circuit components. In addition, adjacent to the left of the inner divider plate 52A is a printed circuit board that is perpendicular to the inner divider plate 52A and that extends vertically. The circuit module 54 according to the preferred embodiment of the invention is mounted on the printed circuit board. A radiating fin 55 is attached to the back surface of the base substrate 1B that constitutes the back surface of the circuit module. The compressor 53, a fan motor, and the circuit components emit heat in the outdoor unit, and the main body of the outdoor unit is installed outdoors. Thus, temperatures inside the outdoor unit rise. Consequently, the circuit module 54 itself is subjected to high temperature.

Now, the expansion coefficient of Al is $23 \times 10^{-6}/°$ C. (that of Cu is $20 \times 10^{-6}/°$ C.). By way of example, a resin substrate has al of 11 to $12 \times 10^{-6}/°$ C. in the x-y direction, and 25 to $30 \times 10^{-6}/°$ C. in the z direction. In addition, $\alpha$ of Si is 2.0 to $4.0 \times 10^{-6}/°$ C. Those coefficients significantly differ from each other. In fact, when temperature of the outdoor unit goes high, the lower part of the casing member 3 considerably expands because of a of the two Al substrates, whereas the printed circuit board side does not expand much. Then, when the casing member 3 itself expands, it will transform into a trapezoidal shape. Accordingly, the printed circuit board 41 warps so as to be convex downward. The curvature means that the printed circuit board warps most at the intersecting point of the center lines in FIG. 1B.

Thus, the second substrate 2 needs to arrange the circuit device off the center area of the second module substrate 41 in FIG. 3. In other words, the arrangement of the circuit device off the center area enable reliability of electrical connection of brazing filler metal, metal wire, and the like to be improved.

Since a greater number of terminals are provided especially in a microcomputer 31 that is a drive device than in other semiconductor devices, reliability can be improved by moving the drive device 31 off the center.

In the following, a further heat release route is described with reference to FIG. 2, and FIG. 4 to FIG. 6. The reference numeral 60 in FIG. 4 shows air flow routes A to B of the air flow to be generated when air rises by heating or effect of the fan 51. Naturally, channels of the radiating fin 55 are provided vertically. Thus, if notches along the air flow routes A to B are also provided in the circuit module 54, the heat release performance will be further improved.

Figure 5:
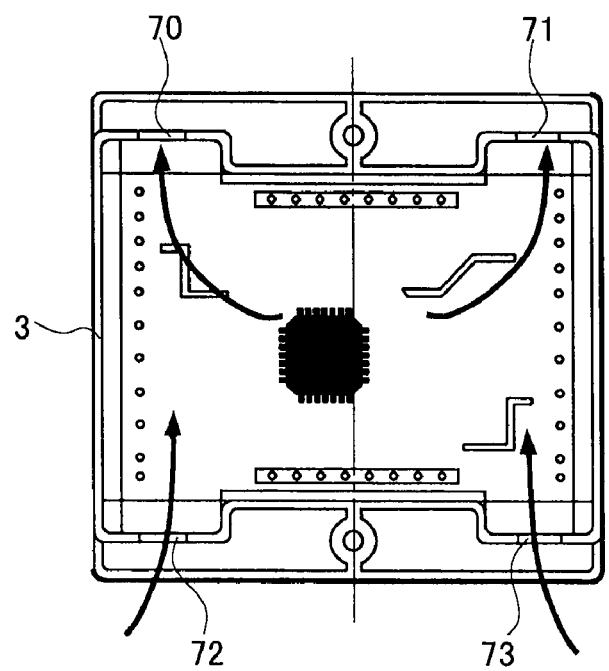
FIG. 5 is a view illustrating notches provided in the circuit module according to the preferred embodiment of the invention.
Figure 6:
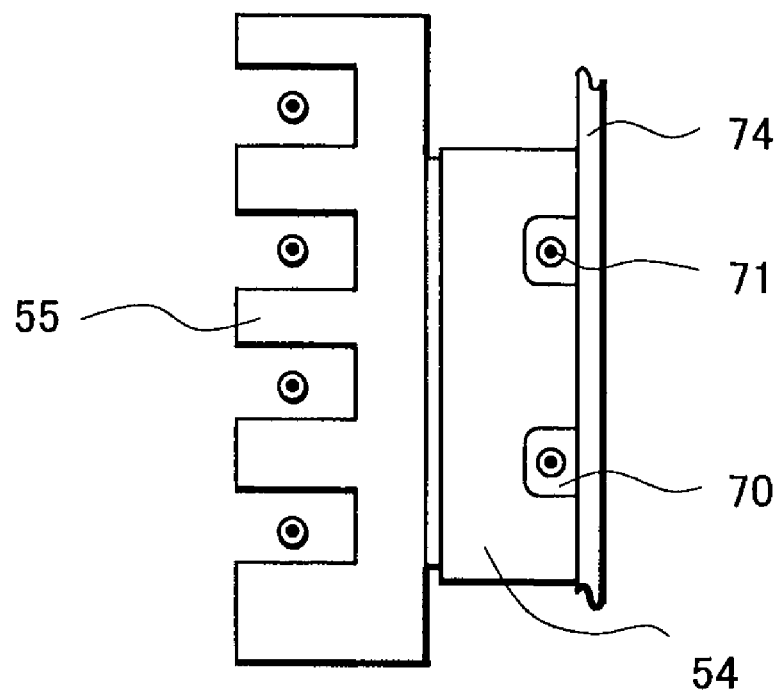
FIG. 6 is view illustrating notches provided in the circuit module according to the preferred embodiment of the invention.

In FIG. 2, the notches are designated by the reference numerals 70 to 73, and also shown in FIG. 5 and FIG. 6. The near side of the circuit module of FIG. 5 faces the printed circuit board 74 in FIG. 4. FIG. 6 is a schematic view of the circuit 54 shown in FIG. 4 and viewed from the top. Encircled black point symbols as shown in the notches 70, 71 or the channels indicate the air flow routes A to B in FIG. 4. The direction of the air flow is from the back to the front of the page.

In summary, heat from the base substrate accumulates in the space under the second substrate 2 in FIG. 1A and flows into the space surrounded by the casing member 3 and the sealing resin of the second substrate through the spaced-apart areas 26 in FIG. 1B. Then, flow in the air flow routes A to B in FIG. 4, namely, the air flow routes for flowing air upward through this space are generated. Hence, highly efficient heat release can be achieved.

As shown in FIG. 3, in the preferred embodiment of the invention, it is possible to space a printed circuit board from a metal substrate through use of casing member. However, deformation of the casing member due to thermal expansion of the metal substrate or deformation of the printed circuit board due to overheating of the printed circuit board by a power semiconductor device can by no means be eliminated. Thus, it is possible to shunt electrical connection to the most curved area by offsetting a circuit device from an intersecting point of the center lines as shown in FIG. 1B. In particular, as IC and LSI that drive a power semiconductor device are most important components of an inverter, etc., improved reliability can be achieved.

What is claimed is:

1. A circuit module comprising:
a first module substrate comprising a first substrate comprising a metal, at least a top surface of the first substrate being electrically insulated, a plurality of first conductive patterns made of an electrically-conductive material and disposed on the top surface of the first substrate, and a power semiconductor device electrically connected with the first conductive patterns and mounted on the first substrate;
a second module substrate comprising a resin substrate, a plurality of second conductive patterns made of an electrically-conductive material and disposed on a top surface of the resin substrate, and a drive device electrically connected with the second conductive patterns and controlling the power semiconductor device; and
a casing member comprising a resin and holding opposing sides of the first module substrate and opposing sides of the second module substrate that is disposed above the first module substrate with an empty space in between,
wherein the drive device is positioned off the center of the resin substrate, and
the second module substrate is configured to be an outermost top cover of the circuit module, and, in plan view of the circuit module, there is an opening between an edge of the second module substrate and a sidewall of the casing member so that the empty space is connected to atmosphere outside the circuit module through the opening.

2. The circuit module according to claim 1, wherein heat generated by the switching semiconductor device is released outside through the opening.

3. A circuit module comprising:
a first module substrate comprising a base substrate comprising a metal, at least a top surface of the base substrate being electrically insulated, a first substrate fixed on the base substrate, at least a top surface of the first substrate being electrically insulated, a plurality of first conductive patterns made of an electrically-conductive material and disposed on the top surface of the first substrate, and a power semiconductor device electrically connected with the first conductive patterns and mounted on the first substrate;
a second module substrate comprising a second substrate comprising a resin, a plurality of second conductive patterns made of an electrically-conductive material and disposed on a top surface of the second substrate, and a drive device electrically connected with the second conductive patterns and controlling the power semiconductor device; and
a casing member comprising a resin and holding opposing sides of the first module substrate and opposing sides of the second module substrate that is disposed above the first module substrate with an empty space in between, wherein
the drive device is positioned off the center of the second substrate, and
the second module substrate is configured to be an outermost top cover of the circuit module, and, in plan view of the circuit module, there is an opening between an edge of the second module substrate and a sidewall of the casing member so that the empty space is connected to atmosphere outside the circuit module through the opening.

4. The circuit module according to claim 3, wherein the first substrate is a metal substrate comprising aluminum or copper, and the second substrate is a glass epoxy substrate.

5. A circuit module comprising:
a first module substrate comprising an aluminum base substrate with a rectangular shape, at least a top surface of the aluminum base substrate being electrically insulated, a first substrate comprising aluminum with a rectangular shape fixed onto the aluminum base substrate by an insulating adhesive and disposed inside a periphery of the base substrate, at least a top surface of the first substrate being electrically insulated, a plurality of first conductive patterns made of an electrically-conductive material and disposed on the top surface of the first substrate, and a switching semiconductor device electrically connected with the first conductive patterns and mounted on the first module substrate, the switching semiconductor device being configured to work with an inverter;
a second module substrate comprising a second substrate comprising a resin, a plurality of second conductive patterns made of an electrically-conductive material and disposed on a top surface of the second substrate, and a microcomputer electrically connected with the second conductive patterns and controlling the switching semiconductor device; and
a casing member comprising a resin and shaped like a quadrangular prism having a hollow portion penetrating from an upper surface to a lower surface thereof, the lower surface of the casing member abutting four sides of the base substrate, the casing member comprising a holding unit holding a back surface of the second substrate inserted in the hollow portion so as to be above the first module substrate with an empty space in between, wherein
the microcomputer is positioned off the center of the second substrate,
the second module substrate is configured to be an outermost top cover of the circuit module and to close the hollow portion, and, in plan view of the circuit module, there is an opening between an edge of the second module substrate and a sidewall of the casing member so that the empty space is connected to atmosphere outside the circuit module through the opening.

* * * * *